(12) United States Patent
Sato

(10) Patent No.: US 8,392,673 B1
(45) Date of Patent: Mar. 5, 2013

(54) DATA WRITING/READING METHOD, A DE-INTERLEAVING METHOD, A DATA PROCESSING METHOD, A MEMORY AND A MEMORY DRIVE APPARATUS

(75) Inventor: Yoshikazu Sato, Kawasaki (JP)

(73) Assignee: NXP B.V., Eindhoven (NL)

( * ) Notice: Subject to any disclaimer, the term of this patent is extended or adjusted under 35 U.S.C. 154(b) by 3086 days.

(21) Appl. No.: 09/830,376

(22) PCT Filed: Aug. 24, 2000

(86) PCT No.: PCT/EP00/08300
§ 371 (c)(1),
(2), (4) Date: Apr. 25, 2001

(87) PCT Pub. No.: WO01/15173
PCT Pub. Date: Mar. 1, 2001

(30) Foreign Application Priority Data

Aug. 26, 1999 (JP) .................................. 99-239424

(51) Int. Cl.
*G06F 12/00* (2006.01)

(52) U.S. Cl. ........................................ 711/157

(58) Field of Classification Search .................. 711/2, 5, 711/127, 157, 218; 370/390; 345/603; 365/189.05, 365/221
See application file for complete search history.

(56) References Cited

U.S. PATENT DOCUMENTS

| | | | |
|---|---|---|---|
| 3,271,749 A * | 9/1966 | Vogl, Jr. et al. | 365/189.05 |
| 4,217,660 A | 8/1980 | En | 371/44 |
| 5,751,730 A | 5/1998 | Mourot | |
| 5,907,560 A | 5/1999 | Spruyt | |
| 5,995,080 A * | 11/1999 | Biro et al. | 345/603 |
| 6,826,181 B1 * | 11/2004 | Higashida et al. | 370/390 |

FOREIGN PATENT DOCUMENTS

| | | |
|---|---|---|
| EP | 0759665 A1 | 2/1997 |
| JP | 2000-078567 A | 3/2000 |

* cited by examiner

*Primary Examiner* — Mardochee Chery

(57) ABSTRACT

A data writing/reading method, a de-interleaving method, a data processing method, a memory, and a memory drive are provided whose costs are reduced. When a plural data interleaved in transmitter (100) are written in memory (110a) of receiver (110), the write direction is alternatively changed to row direction and column direction.

14 Claims, 10 Drawing Sheets

|  | first column | second column | third column | --- | seventh column | eighth column |
|---|---|---|---|---|---|---|
| address | 0 | 1 | 2 |  | 6 | 7 |
| first-row | 1_1 | 2_1 | 3_1 | --- | 7_1 | 8_1 |
|  | 8 | 9 | 10 |  | 14 | 15 |
| second-row | 1_2 | 2_2 | 3_2 | --- | 7_2 | 8_2 |
|  | ⋮ | ⋮ | ⋮ | ⋮ | ⋮ | ⋮ |
|  | 48 | 49 | 50 |  | 54 | 55 |
| seventh-row | 1_7 | 2_7 | 3_7 | --- | 7_7 | 8_7 |
|  | 56 | 57 | 58 |  | 62 | 63 |
| eighth-row |  |  |  | --- |  |  | column direction R row direction L

| address | first column | second column | third column | ... | seventh column | eighth column |
|---|---|---|---|---|---|---|
| | 0 | 1 | 2 | | 6 | 7 |
| first-row | 1_8 | 2_1 | 3_1 | --- | 7_1 | 8_1 |
| | 8 | 9 | 10 | | 14 | 15 |
| second-row | 2_8 | 2_2 | 3_2 | --- | 7_2 | 8_2 |
| | ⋮ | ⋮ | ⋮ | | ⋮ | ⋮ |
| | 48 | 49 | 50 | | 54 | 55 |
| seventh-row | 7_8 | 2_7 | 3_7 | --- | 7_7 | 8_7 |
| | 56 | 57 | 58 | | 62 | 63 |
| eighth-row | 8_8 | | | --- | | | column direction R ↓ row direction L →

FIG. 9

| address | first column | second column | third column | ... | seventh column | eighth column |
|---|---|---|---|---|---|---|
| | 0 | 1 | 2 | | 6 | 7 |
| first-row | 1_8 | 1_9 | 1_10 | --- | 1_14 | |
| | 8 | 9 | 10 | | 14 | 15 |
| second-row | 2_8 | 2_9 | 2_10 | --- | 2_14 | |
| | ⋮ | ⋮ | ⋮ | | ⋮ | ⋮ |
| | 48 | 49 | 50 | | 54 | 55 |
| seventh-row | 7_8 | 7_9 | 7_10 | --- | 7_14 | |
| | 56 | 57 | 58 | | 62 | 63 |
| eighth-row | 8_8 | 8_9 | 8_10 | --- | 8_14 | | column direction R ↓ row direction L →

FIG. 10

DATA WRITING/READING METHOD, A DE-INTERLEAVING METHOD, A DATA PROCESSING METHOD, A MEMORY AND A MEMORY DRIVE APPARATUS

The present invention relates to a data writing/reading method of writing data into memory and reading the data written into the memory, a de-interleaving method to which the data writing/reading method is applied, a data processing method to which the data writing/reading method is applied, a memory where data is written by using the data writing/reading method and a memory drive apparatus for writing and reading data by executing the data writing/reading method.

A transceiving system for transceiving data is provided with a transmitter and a receiver for receiving the data transmitted from the transmitter. Among transceiving systems, in a digital broadcasting system, to distribute burst error occurring on transmission line when transmitting the data from a transmitter to a receiver, the transmitter constitutes two superframes in which data to be transmitted is arranged into block form, and interleaves the data constituting the two superframes. Next, the transmitter reads out the interleaved data and transmits the read data to the receiver. FIG. 2 to be described later shows a schematic diagram of superframes constituted in a transmitter.

In FIG. 2, only one superframe 1 of two superframes constituted is shown. However, the other superframe has completely the same configuration as the illustrated superframe 1. Therefore, the configuration of the superframe is mainly explained by using the superframe 1 shown in FIG. 2.

The superframe 1 has 8 frames marked the number of 1-8, i.e. frame 1, frame 2, frame 3, . . . , . . . , . . . , frame 8. One frame is constituted of 48 slots 1, 2, 3, . . . , . . . , . . . , 48 arranged in y-direction. One slot is constituted by arranging 204 data in x-direction, each data consists of 1 byte. Since one data of 204 data is a data excluded from interleaving objects, FIG. 2 shows a configuration in which 203 data are arranged in x-direction. Therefore, the following description is made by assuming that 203 data are arranged in x-direction. In this case, 1 byte is equal to 8 bits.

When the superframe 1 shown in FIG. 2 is constituted, data constituting the superframe 1 are sequentially read in the interleaving direction from data 1_1 of slot 1 present at the uppermost layer of frame 1, and the read data is transmitted to a receiver. When data 8_203 of slot 48 of frame 8 is finally read, the read of all data constituting one superframe 1 is completed. Thus, by sequentially reading data in the interleaving direction, data constituting one superframe are interleaved and transmitted to the receiver.

When the reading of data from the superframe 1 is completed, data constituting another superframe (hereafter referred to as superframe 2) are read by the same method and transmitted to the receiver. While data constituting the superframe 2 are read and transmitted to the receiver, a superframe 1 consisting of new data is constituted in a memory of the transmitter. When transmission of data constituting the superframe 2 is completed, data constituting the superframe 1 consisting of the new data are sequentially read in the interleaving direction and transmitted to the receiver. Thus, in the transmitter, while data of one superframe is read from a memory, the other superframe is constituted by having new data written in the memory. That is, in the transmitter, to write the data constituting the superframe 1 and to write the data constituting the superframe 2 in a memory are alternately executed, and to read the data constituting the superframe 1 and to read the data constituting the superframe 2 from the memory are alternately executed.

The receiver comprises a memory in which a plural interleaved data transmitted from the transmitter are written. The memory of the receiver has a capacity enough to write the data of two superframes constituted in the transmitter. In the half area of the memory of the receiver, to write and read the data constituting the superframe 1 are repeatedly executed, and in the remaining half area of the memory of the receiver, to write and read the data constituting another superframe 2 are repeatedly executed. Thereby, it is possible to sequentially interleave a plural interleaved data transmitted from the transmitter.

One superframe constituted in the transmitter consists of 8 frames as described above. Each frame consists of 48 slots, and one slot consists of 203 one-byte data. Therefore, one superframe has a capacity of 203(=the number of one-byte data constituting one slot)×48(the number of slots of one frame)×8(the number of frames of one superframe)=77952 bytes. Since a transmitter normally constitutes two superframes, a memory of a receiver requires a capacity of 77952 bytes×2=155904 bytes, that is, approx. 1.25 Mbits so that data of these two superframes can be written. Therefore, a memory of approx. 1.25 Mbits is necessary only to interleave data and thus, a problem occurs that the cost for receiving data increases.

The present invention is made to solve the above problem and its object is to provide a data writing/reading method, a de-interleaving method, a data processing method, a memory, and a memory drive whose costs are reduced.

A data writing/reading method according to the present invention is a method of sequentially writing plural data into memory in a write direction and sequentially reading the plural data written into the memory in a read direction, characterized in that a write direction when plural data next to the plural data having written into the memory at present are written into the memory is set to same direction as or opposite direction to a read direction when the plural data having written into the memory at present are read.

Conventionally, when sequentially writing a plural data in a memory having a plural memory cells where data is written, and subsequently rearranging and reading the data already written in the memory, the memory is divided into two areas such as first area and second area, and data is written in and read from each area. In this case, a plural data are written in the first area of the memory and the written data are rearranged and read, on the other hand, a plural other data are written in the second area while data is read from the first area and the other data already written in the second area is rearranged and read while data is written in the first area. That is to say, conventionally, a memory requires not only a first area but also a second area in order to write and read data.

However, in the case of a data writing/reading method according to the present invention, a write direction when plural data next to the plural data having written into the memory at present are written into the memory is set to same direction as or opposite direction to a read direction when the plural data having written into the memory at present are read. Therefore, the arrangement direction of memory cells of the memory arranged in the read direction coincides with the arrangement direction of memory cells arranged in the data write direction of the data to be next written. Therefore, a data writing/reading method according to the present invention makes it possible to write the next data in an area from which data is currently being read while reading data from the area. As described above, conventionally, a memory requires a second area in addition to a first area in such a way that a plural new data can be written. In the case of a data writing/reading method of the present invention, however, an area corresponding to a conventionally-necessary second area is unnecessary for a memory, the memory requires only a small capacity for rearranging data, and the cost is reduced.

Preferably, a data writing/reading method according to the present invention, wherein when plural data having written into the memory at present are read in a row direction, plural data which is the next to be written are sequentially written in the row direction, on the other hand, when plural data having written into the memory at present are read in a column direction, plural data which is the next to be written are sequentially written in the column direction.

By setting the write direction of a plural data to be next written to the row direction or column direction on the basis of whether a plural currently-written data will be read in the row direction or column direction, it is possible to write the next data in an area from which data is currently being read while reading the data from the area.

Preferably, a data writing/reading method according to the present invention, wherein plural data are arranged into the memory in matrix structures having n by n blocks, each of the blocks having at least one address, and each of the blocks for writing at least one data into an area corresponding to the one address of each of the blocks.

By arranging data into a matrix structure having n by n blocks, it is possible to equalize the number of data to be written in the row direction with the number of data to be written in the column direction. Therefore, it is possible to make the number of data to be read in the row direction and the number of data to be read in the column direction equal to each other.

A de-interleaving method according to the present invention is a method of de-interleaving by sequentially writing plural data into memory in a write direction and sequentially reading the plural data written into the memory in a read direction, characterized in that a write direction when plural data next to the plural data having written into the memory at present are written into the memory is set to same direction as or opposite direction to a read direction when the plural data having written into the memory at present are read.

A de-interleaving method according to the present invention is a method to which a data writing/reading method according to the present invention is applied. Therefore, when writing interleaved data in a memory and then de-interleaving and reading the interleaved data, it is possible to write new interleaved data in an area from which data is currently being read while reading data from the area. Therefore, a memory requires only a small capacity for de-interleaving a plural interleaved data and it is possible to de-interleave a plural interleaved data at a low cost.

Preferably, a de-interleaving method according to the present invention, wherein when plural data having written into the memory at present are read in a row direction, plural data which is the next to be written are sequentially written in the row direction, on the other hand, when plural data having written into the memory at present are read in a column direction, plural data which is the next to be written are sequentially written in the column direction.

By writing data as described above, it is possible to write the next data in an area from which data is currently being read while reading data from the area.

Preferably, a de-interleaving method according to the present invention, wherein interleaved plural data are arranged into the memory in matrix structures having n by n blocks, each of the blocks having at least one address, and each of the blocks for writing at least one data into an area corresponding to the one address of each of the blocks.

By arranging data into a matrix structure having n by n blocks, it is possible to equalize the number of data de-interleaved by reading the data in the row direction with the number of data de-interleaved by reading the data in the column direction.

Moreover, as to a de-interleaving method according to the present invention, in the case of de-interleaving the same number of data even if the data already written in a memory are read in the row direction or column direction, it is possible to decrease the number of memory cells of the memory where no data is written, by arranging a plural interleaved data into a matrix structure having n by n blocks as mentioned-above. Therefore, a plural interleaved data are written efficiently in the memory.

A data processing method according to the present invention is a method comprising:
a first step of interleaving plural data, and a second step of de-interleaving by sequentially writing the interleaved plural data into memory in a write direction and sequentially reading the plural data written into the memory in a read direction, wherein, the second step is characterized in that a write direction when plural data next to the plural data having written into the memory at present are written into the memory is set to same direction as or opposite direction to a read direction when the plural data having written into the memory at present are read.

A data processing method according to the present invention is a method of executing a data writing/reading method of the present invention. Therefore, it is possible to de-interleave a plural interleaved data at a low cost.

Preferably, a data processing method according to the present invention, wherein the second step is characterized in that when plural data having written into the memory at present are read in a row direction, plural data which is the next to be written are sequentially written in the row direction, on the other hand, when plural data having written into the memory at present are read in a column direction, plural data which is the next to be written are sequentially written in the column direction.

By writing data as described above, it is possible to write a plural new data interleaved in the first step in an area from which data is currently being read while reading data from the area.

Preferably, a data processing method according to the present invention, wherein the first step contains configuring a super frame having plural frames, each of the frames formed by arranging plural data in matrix form, and contains interleaving the plural data configuring the super frame.

By configuring a superframe, it is possible to apply a data processing method of the present invention to a digital broadcasting system.

Preferably, a data processing method according to the present invention, wherein the second step is characterize in that interleaved plural data are arranged into the memory in matrix structures having n by n blocks, each of the blocks having at least one address, and each of the blocks for writing at least one data into an area corresponding to the one address of each of the blocks.

By arranging data into a matrix structure having n by n blocks, it is possible to equalize the number of data de-interleaved by reading the data in the row direction with the number of data de-interleaved by reading the data in the column direction. And as to a data processing method according to the present invention, in the case of de-interleaving the same number of data even if the data already written in a memory are read in row direction or column direction, it is possible to decrease the number of memory cells of the memory where no data is written, by arranging a plural interleaved data into a matrix structure having n by n blocks as mentioned-above. Therefore, a plural interleaved data can be written efficiently in the memory.

Preferably, a data processing method according to the present invention, wherein the first step is characterized by configuring a super frame having eight frames, each of the frames formed by arranging (203×48) data in matrix form, and is characterized by interleaving (203×48×8) data configuring the super frame, and the second step is characterized in that when (203×48×8) data having written into the memory at present are read in a row direction, (203×48×8) data which is the next to be written are sequentially written in the row direction, on the other hand, when (203×48×8) data having written into the memory at present are read in a column direction, (203×48×8) data which is the next to be written are sequentially written in the column direction.

In the case of BS digital broadcast, at the transmitter side, a superframe having 8 frames, each of the frames formed by arranging (203×48) data in matrix form, is normally constituted and the (203×48×8) data constituting the superframe are interleaved. Therefore, by arranging the first step to the above step, it is possible to apply a data processing method according to the present invention to a aspect suitable for BS digital broadcast.

Preferably, a data processing method according to the present invention, wherein the second step is for arranging (203×48×8) data into the memory in 48 matrix structures, each of the 48 matrix structures formed from (203×8) data, and each of the 48 matrix structures is the structure having n by n blocks, each of the blocks having at least one address, and each of the blocks for writing at least one data into an area corresponding to the one address of each of the blocks.

By arranging (203×48×8) data into a 48 matrix structure, it is possible to de-interleave (203×48×8) data every (203×8) data. And, in the case of de-interleaving the same number of data even if the data already written in a memory are read in row direction or column direction, it is possible to decrease the number of memory cells of the memory where no data is written, by arranging a plural interleaved data into a matrix structure having n by n blocks as mentioned-above. Therefore, a plural interleaved data can be written efficiently in the memory.

Preferably, a data processing method according to the present invention, wherein each of the 48 matrix structures is the structure having 8 by 8 blocks, each of the blocks having 26 addresses, and each of the blocks for writing one data into an area corresponding to the one address of each of the blocks, and the second step is for writing one data into the area corresponding to the one address of each of the blocks. And, preferably, a data processing method according to the present invention, wherein each of the 48 matrix structures is the structure having 8 by 8 blocks, each of the blocks having 4 addresses, and each of the blocks for writing 7 data into an area corresponding to the one address of each of the blocks, and the second step is for writing the 7 data into the area corresponding to the one address of the matrix structures.

Memory according to the present invention is a memory for sequentially writing plural data in a write direction and sequentially reading the written plural data in a read direction, characterized in that a write direction when plural data next to the plural data having written into the memory at present are written into the memory is set to same direction as or opposite direction to a read direction when the plural data having written into the memory at present are read.

A memory drive apparatus is a apparatus for sequentially writing plural data into memory in a write direction and sequentially reading the plural data written into the memory in a read direction, characterized in that a write direction when plural data next to the plural data having written into the memory at present are written into the memory is set to same direction as or opposite direction to a read direction when the plural data having written into the memory at present are read.

A memory drive apparatus according to the present invention is a apparatus for executing a data writing/reading method of the present invention. Therefore, by using a memory drive apparatus according to the present invention, it is possible to write next data in an area from which data is currently being read while reading data from the area. Therefore, it is possible to rearrange data by a memory having a small capacity.

Preferably, a memory drive apparatus according to the present invention, wherein when plural data having written into the memory at present are read in a row direction, plural data which is the next to be written are sequentially written in the row direction, on the other hand, when plural data having written into the memory at present are read in a column direction, plural data which is the next to be written are sequentially written in the column direction.

Preferably, a memory drive apparatus according to the present invention, wherein the apparatus provides with addressing means for addressing the memory, and by sequentially addressing the memory with the addressing means, plural data are arranged into the memory in matrix structures having n by n blocks, each of the blocks having at least one address, and each of the blocks for writing at least one data into an area corresponding to the one address of each of the blocks.

For example, by writing one data in an area corresponding to one address, it is unnecessary to temporarily rearrange a plural data before writing them in a memory. That is to say, a buffer for temporarily rearranging data before writing them in a memory is unnecessary and there is an advantage that the cost is further reduced. On the other hand, by writing a plural data in an area corresponding to one address, a buffer for temporarily rearranging data before writing them in a memory is necessary. However, since the number of addresses of the memory can be decreased, advantages are obtained that the configuration of an address generation circuit is simplified and the application to a memory having a low access speed is possible. These advantages are in more detail described for the embodiment to be described later. Moreover, by arranging a plural data into a matrix structure having n by n blocks, it is possible to efficiently write the data in a memory.

MODE FOR CARRYING OUT THE INVENTION IS DESCRIBED BELOW

FIG. 1 is an illustration showing the first transceiving system.

The transceiving system is provided with a transmitter 100 and a receiver 110 connected with each other by a transmission line 120. The transmitter 100 comprises a memory 100a in which data is written and from which the written data is read, and a memory drive apparatus 100b. The memory drive apparatus 100b temporarily writes a plural data in the memory 100a before transmitting the data to a receiver 110 and then interleaves and reads the data already written in the memory 100a. When the data are sequentially written in the memory 100a by the memory drive apparatus 100b, the superframe shown in FIG. 2 is constituted.

Figure 2:
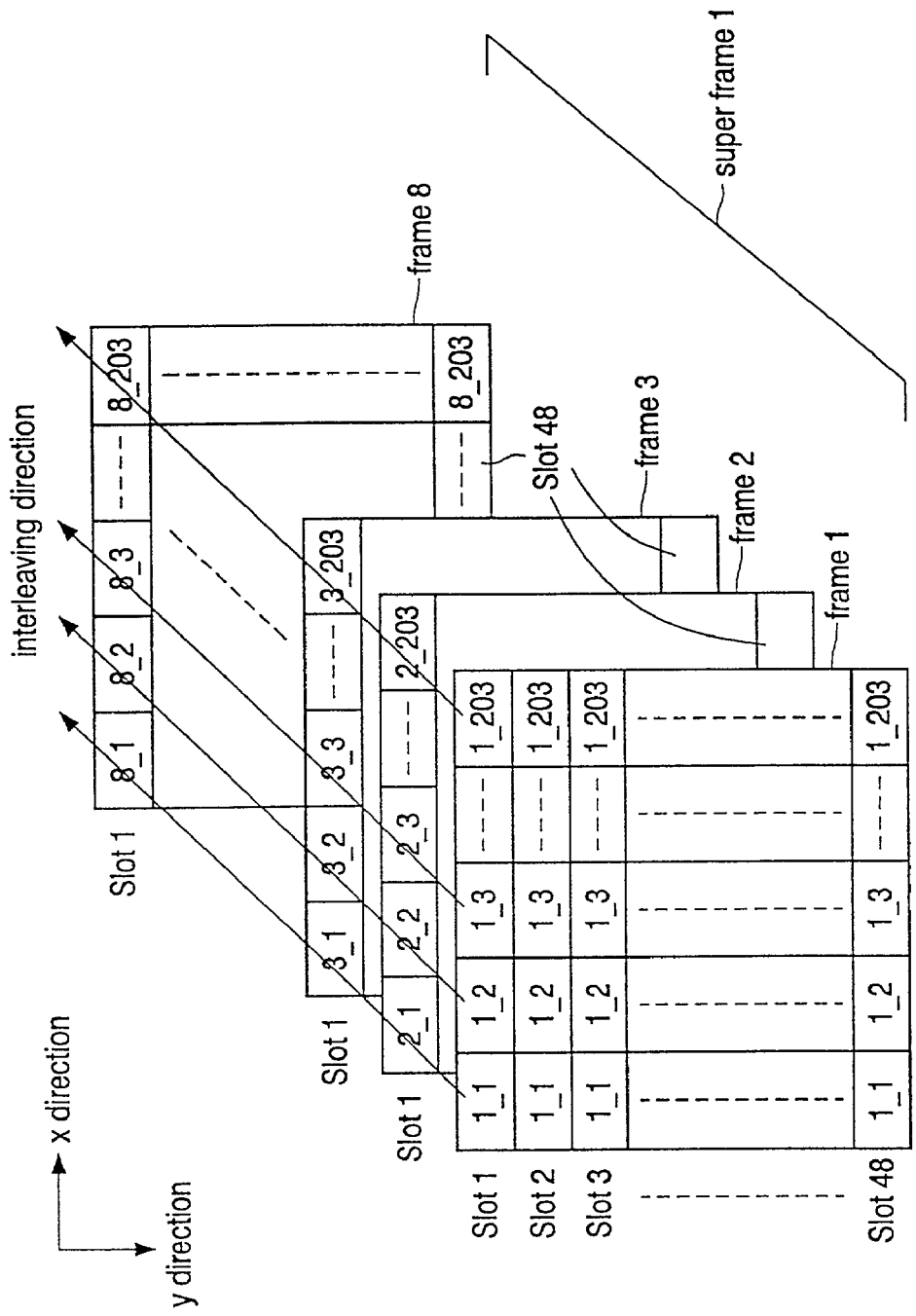

In the transmitter 100, to constitute the superframe 1 shown in FIG. 2, data are sequentially written in the memory of the transmitter, slots 1, 2, 3, . . . , and 48 are sequentially constituted each of which comprises 203 data 1_1, 1_2, 1_3, . . . , 1_203, and a frame 1 is constituted. Then, slots 1, 2, 3, . . . , and 48 each of which comprises 203 data 2__1, 2_2, . . . , and 203 are sequentially constituted and a frame 2 is constituted. Hereafter similarly, frames 3, . . . , and 8 each of which is constituted of 48 slots respectively comprising 203 data are sequentially constituted. Thereby, a superframe 1 is constituted.

Figure 1:
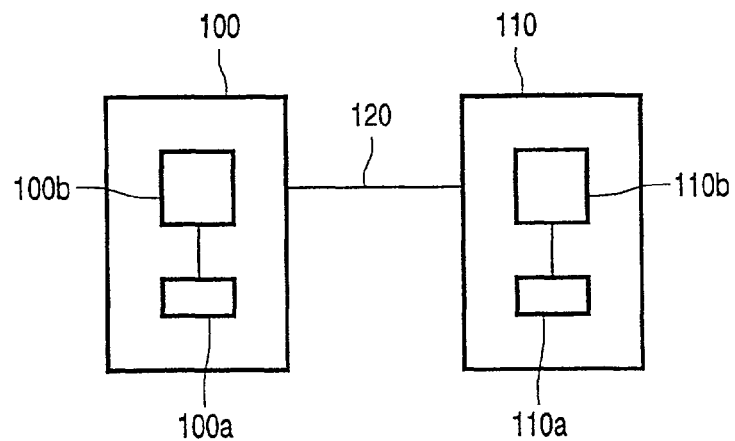
FIGS. 1 to 6 are illustrations for explaining states in which a plural data are interleaved and the interleaved data are de-interleaved by using a transceiving system (hereafter referred to as first transceiving system) for executing a data processing method to which a first mode of embodiment of a data writing/reading method according to the present invention is applied.

When the superframe 1 is constituted in the transmitter 1 as shown in FIG. 2, data constituting the superframe 1 are sequentially read by the memory drive apparatus 100b in the interleaving direction in the order of data 1_1 of uppermost slot 1 of frame 1, data 2_1 of slot 1 of frame 2, data 3_1 of slot 1 of frame 3, . . . , and data 8_1 of slot 1 of frame 8, the read data are transmitted to the receiver 110 through the transmission line 120 (refer to FIG. 1). Moreover, after data 8_1 of slot 1 of frame 8 have been read, data 1_2 of slot 1 of frame 1, data 2_2 of slot 1 of frame 2, data 3_2 of slot 1 of frame 3, . . . , and data 8_2 of slot 1 of frame 8 are sequentially read in the interleaving direction and transmitted to the receiver 110. After data 8_2 of slot 1 of frame 8 have been read, data are sequentially read in the interleaving direction starting with data 1_3 of slot 1 of frame 1. Thus, data of slots 1 of the frames are sequentially read in the interleaving direction starting with data value 1_1 of slot 1 of frame 1. By this means, 203 data are read in the interleaving direction starting with data 1_1 of slot 1 of frame 1 and the 203 read data are transmitted to the receiver 110 (that is, data from data 1_1 of slot 1 of frame 1 to data 3_26 of slot 1 of frame 3 are read and transmitted).

Figure 3:
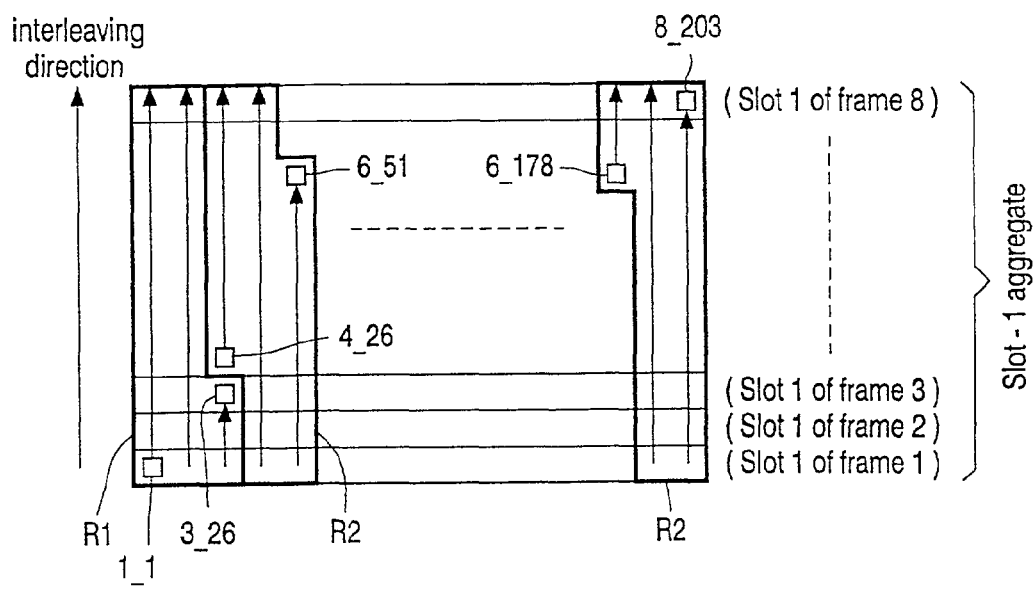

FIG. 3 is a schematic diagram showing a state in which 203 data are read in the interleaving direction starting with data value 1_1 of slot 1 of frame 1. FIG. 3 shows slots 1 of frames 1 to 8 constituting the superframe 1, with the slots 1 arranged.

Reading data R1 consists of 203 data from data 1_1 of slot 1 of frame 1 up to data 326 of slot 1 of frame 3 (that is, data for 203 bytes). Thus, after 203 data have been read, as to slot 2 (refer to FIG. 2) which is one stage lower than slot 1 of each frame, 203 data are read in the interleaving direction starting with data 1_1 of slot 2 of frame 1 and the 203 read data are transmitted to the receiver 110. Hereafter similarly, as to slot 3-slot 48 which are lower than slot 2 of each frame, 203 data are read form each slot aggregate consisting of the collection of slots marked the same number in the interleaving direction starting with data value 1_1, and the 203 read data are transmitted to the receiver 110. Hereafter, a slot aggregate consisting of the collection of slots 1 of the each frames is referred to as slot-1 aggregate, and slot aggregates consisting of the collection of the slots 2, . . . , and slots 8 of the each frames are respectively referred to as slot-2 aggregate, . . . , and slot-8 aggregate.

After 203 data have been are read from slot-48 aggregate consisting of the collection of slots 48 of the each frames and the 203 read data are transmitted to the receiver 110, the other 203 data are also read in the interleaving direction starting with data 4_26 of uppermost slot 1 adjacent to the finally read data 3_26 of the reading data R1 (refer to FIG. 3) previously read, and the other 203 read data are transmitted to the receiver 110. Reading data R2 shown in FIG. 3 consists of 203 data which are read in the interleaving direction starting with data 4_26 of slot 1 of frame 4 (that is, the 203 data is from data 4_2 of slot 1 of frame 4 up to data 6_51 of slot 1 of frame 6). After data 6_51 of slot 1 of frame 6 has been read, as to slot 2-slot 48 which are lower than slot 1 of each frame, 203 data are read form each slot aggregate consisting of the collection of slots marked the same number in the interleaving direction starting with data 4_26 of slot 1 of frame 4, and the 203 read data are transmitted to the receiver 110. Hereafter, the read of 203 data is sequentially repeated every slot aggregate consisting of the collection of slots marked the same number. Reading data R3 shown in FIG. 3 shows 203 data from data 6_178 of slot 1 of frame 6 up to data 8_203 of slot 1 of frame 8. The read of all data in the slot-1 aggregate consisting of the collection of slots 1 of the each frames are completed by finishing the read of the reading data R3, all data in the slot-1 aggregate are transmitted to the receiver 11. By the way, one slot consists of 203 data and the superframe 1 consists of 8 frames. Therefore, when considering a slot aggregate consisting of the collection of slots marked the same number of each frame, the each slot aggregates consists of the 203×8 data. Therefore, when 203 data are read as described above, all data constituting one slot aggregate are read by performing the read of 203 data 8 times. After the reading data R3 has been read, as to slots marked the number 2-48, a plenty data from data 6_178 of slot 1 of frame 6 up to data 8_203 of slot 1 of frame 8 are sequentially read. When data 8_203 of slot 48 of frame 8 is read, the read of all data constituting one superframe 1 is completed. Thus, by sequentially reading data in the interleaving direction, data constituting one superframe are interleaved and transmitted to the receiver 110.

When the read of data of the superframe 1 is completed as described above, data constituting another superframe 2 are read in the same manner and transmitted to the receiver 110. While data constituting the superframe 2 are read and transmitted to the receiver 110, new data are sequentially written in the memory 100a of the transmitter 100 by the memory drive apparatus 100b and a superframe 1 consisting of new data is constituted. After transmission of data constituting the superframe 2 has been completed, the data constituting the superframe 1 consisting of new data are sequentially read in the interleaving direction and transmitted to the receiver 110. Thus, in the transmitter 100, while data of one superframe are read from the memory 100a, data are newly written in the memory 100a and another superframe is constituted. That is, in the transmitter 100, the write of data constituting the superframe 1 and the write of data constituting the superframe 2 in the memory 100a are alternately executed, and the read of data constituting the superframe 1 and the read of data constituting the superframe 2 from the memory 100a are alternately executed.

Data read from the memory 100a are transmitted to the receiver 110 shown in FIG. 1. The receiver 110 comprises a memory (which is one example of memory according to the present invention) 110a and a memory drive apparatus (which is one example of memory drive apparatus according to the present invention) 110b. Data is written in the memory 110a and the written data is read form the memory 110a. The memory drive apparatus 110b addresses the memory 110a and writes the data transmitted from the transmitter 100 in an area corresponding to the addressed address, and the memory drive apparatus 110b de-interleaves and reads the written data. A state in which the memory drive apparatus 110b sequentially writes data in the memory 110a is described below by referring to FIG. 4.

Though the interleaving of data by the transmitter 100 is executed every superframe, the de-interleaving by the receiver 110 is executed for each data constituting slot aggregate consisting of the collection of slots with the same number of frames 1, 2, 3, . . . , and 8 (refer to, FIG. 2). Since each frame consists of 48 slots, there are 48 slot aggregates. In order to de-interleave the data constituting the 48 slot aggregates for each data constituting each slot aggregate, a plural data constituting one superframe interleaved by the transmitter 100 are divided into 48 matrix structures and arranged when the data are sequentially written in the memory 110a of the receiver 110. In this case, one matrix structure is constituted a plural data constituting a slot aggregate consisting of the collection of slots with the same number of frames 1, 2, 3, . . . , and 8. As the whole of 48 matrix structures, each matrix structure is constituted of data constituting one slot aggregate of slot-1 aggregate, . . . , and slot-48 aggregate. A method of de-interleaving a plural data arranged into a matrix structure is the same for 48 matrix structures. Therefore, by noticing only slot 1 among slots 1, 2, 3, . . . , and 48 of each of 8 frames 1, 2, 3, . . . , and 8, in the case that the data constituting the slot-1 aggregate consisting of the collection of slots 1 of the each frames are interleaved and transmitted to the receiver 110, how the interleaved data are de-interleaved is described below by referring to FIG. 4.

Figure 4:
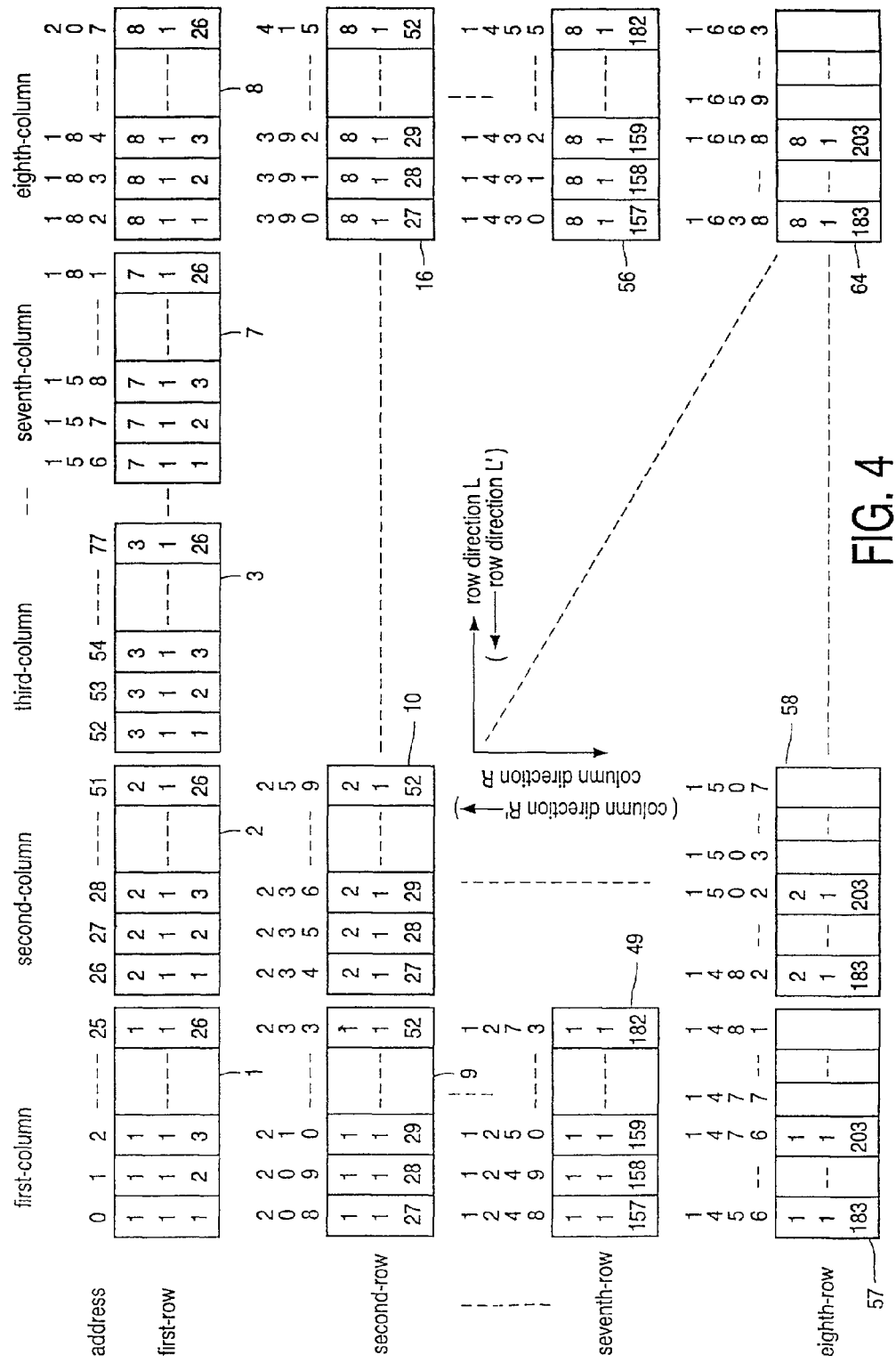

As described above, in the transmitter 100, data constituting the slot-1 aggregate consisting of the collection of slots 1 are read in the interleaving direction starting with data value 1_1 of slot 1 of frame 1, and finally, data 8_203 of slot 1 of frame 8 is read and the read of data constituting the slot-1 aggregate is completed. In this case, these read data are transmitted to the receiver 110, and the transmitted each data is sequentially written in the memory 110a of the receiver 110 in the order in which the transmitter 100 read the each data. In this case, these data are arranged into a matrix structure having 64 blocks 1, 2, 3, . . . , and 64 with 8 rows and 8 columns as shown in FIG. 4. Each block has 26 addresses and a 1-byte data can be written in an area corresponding to one address. Therefore, it is possible to write up to 26 data in one block. A numeral attached to the top of each block shows an address. All data of the slot-1 aggregate are arranged into the matrix structure.

In the case of arranging all data of the slot-1 aggregate into a matrix structure, data are firstly written in the first-row blocks 1 to 8 arranged in the row direction L. To write data in the first-row blocks 1 to 8, data 1_1, 2_1, 3_1, . . . , 7_1, and 8_1 sequentially transmitted from the transmitter 100 are sequentially written in areas corresponding to first addresses 0, 26, 52, . . . , 156, and 182 of the each blocks in the row direction L. In FIG. 2, each date is shown by a horizontally-written symbol. In FIG. 4, however, each data is shown by a vertically-written symbol on account of space consideration. Moreover, an address number shown by 3 or 4 digits is vertically written on account of space consideration.

After data 8_1 has been written in the area corresponding to address 182, data 1_2, 2_2, 3_2, . . . , 7_2, and 8_2 newly transmitted from the transmitter 100 are sequentially written in areas corresponding to second addresses 1, 27, 53, . . . , 157, and 183 of blocks 1 to 8 in the row direction L. Hereafter similarly, data 1_n, 2_n, 3_n, . . . , 7_n, and 8_n newly transmitted from the transmitter 100 are sequentially written in areas corresponding to nth addresses of block 1 to 8 in the row direction L, and finally, data 1_26, 2_26, 3_26, . . . , 7_26, and 8_26 are written in areas corresponding to final addresses 25, 51, 77, . . . , 181, and 207 of blocks 1 to 8 in the row direction L. Thus, each data is written in block 1 to 8. When independently viewing each block, 26 data written in blocks 1 to 8 are 26 data of 203 data constituting each slots 1 of frames 1 to 8 shown in FIG. 2, the 26 data continuously arranged in x-direction from the top of slot.

After data have been written in block 1 to 8, data are written in second-row blocks 9 to 16 arranged in the row direction L. The write of data in these blocks is performed as same as the write of data in block 1 to 8; That is to say, data 1_27, . . . , and 8_27 newly transmitted from the transmitter 100 are sequentially written in areas corresponding to top addresses 208, . . . , and 390 of blocks 9 to 16 along the row direction, after data 8_27 is written in the area corresponding to address 390, data 1_28, . . . , and 8_28 are sequentially written in areas corresponding to second addresses 209, . . . , and 391 of the blocks in the row direction L, finally data 1_52, . . . , and 8_52 are sequentially written in areas corresponding to final addresses 233, . . . , and 415 of the blocks in the row direction L, and the write of data in blocks 9 to 16 is completed. After the write of data in blocks 9 to 16 is completed, the write of data in third-row blocks (not illustrated), . . . , and the write of data in seventh-row blocks 49 to 56 arranged in the row direction L are similarly performed every blocks arranged in the row direction L.

After the write of data in blocks 49 to 56 is completed, the write of data in eighth-row blocks 57 to 64 is performed. To write data in blocks 57 to 64, data 1_183, . . . , and 8_183 are sequentially written in areas corresponding to top addresses 1456, . . . , and 1638 of blocks 57 to 64 in the row direction L. Hereafter, data are written in areas corresponding to second, third, . . . addresses of blocks 57 to 64 in the row direction L. When data are written in 21st addresses 1476, . . . , and 1658 from top addresses of blocks 57 to 64, data 1_203, . . . , and 8_203 are sequentially written in areas corresponding to the addresses 1476, . . . , and 1658 in the row direction L. As described above, in the transmitter 100, the read of data constituting the slot-1 aggregate is started with data 1_1 in the interleaving direction and completed when final data 8_203 is read. Therefore, when data 8_203 has been written in the area corresponding to address 1658 of block 64, the write of all data of the slot-1 aggregate is completed. Thereby, as shown in FIG. 4, data 1_1, . . . , and 8_203 are written like a matrix.

As described above, it is possible to write up to 26 data in each block and the slot-1 aggregate consists of 203×8=1624 data. Therefore, by sequentially writing data constituting the slot-1 aggregate in the row direction L as described above, 26(=the number of data to be written in one block)×7(=the number of blocks arranged in the column direction R among the first-row to seventh-row blocks 1 to 56)×8(=the number of blocks arranged in the row direction L among the first-row to seventh-row blocks 1 to 56)=1456 data among 1624 data constituting the slot-1 aggregate are written in the first-row to seventh-row blocks 1 to 56 among 64 blocks 1 to 64 with 8 rows and 8 columns. Therefore, 168 (=1624−1456) remaining data are written in eighth-row blocks 57 to 64. Since it is possible to write 26 data in each block, by writing data in eighth-row block 57 to 64 in the row direction L as described above, the write of 168 remaining data is completed when 21(=168/8) data have written in each of eighth-row blocks 57 to 64, and all data constituting the slot-1 aggregate are written. Therefore, as to the first-row to seventh-row blocks 1 to 56, data is written in all areas corresponding to 26 addresses. However, as to eighth-row blocks 57 to 64, data is written in only areas corresponding to 21 addresses among areas corresponding to 26 addresses but no data is written in areas corresponding to 5 remaining addresses.

After the write of data in eighth-row blocks 57 to 64 has been completed, data of blocks 1 to 64 are read.

To read data, data already written in first-column blocks 1, 9, ..., 49, and 57 arranged in the column direction R are first sequentially read. To read data from blocks 1, 9, ..., 49, and 57, addresses 0 to 25 of block 1 are respectively incremented from top address 0 and sequentially addressed, and data 1_1, 1_2, 1_3, ..., and 1_26 are read from areas corresponding to addresses 0, 1, 2, ..., and 25. Hereafter similarly, data already written in blocks 9, ..., and 57 are sequentially read in the order of blocks 9, ..., and 57 by incrementing address. Thus, by sequentially reading data in the column direction R, data already written in blocks 1, 9, ..., 49, and 57 are de-interleaved and data 1_1 to 1_203 are continuously read. Therefore, data interleaved by the transmitter 100 and transmitted to the receiver 110 are sequentially written in the row direction L, on the other hand, the written data in the row direction L are sequentially read in the column direction R, as the result, data 1_1 to 1_203 constituting slot 1 of frame 1 shown in FIG. 2 are de-interleaved and read.

After data of blocks 1, 9, ..., 49, and 57 have been read, data of second-column blocks 2, 10, ..., and 58 are read. To read data of these blocks 2, 10, ..., and 58, addresses of block 2 are sequentially addressed by incrementing them one by one starting with top address 26, and data 2_1, 2_2, 2_3, ..., and 2_26 are read from areas corresponding to addresses 26, 27, 28, ..., and 51. After data 2_26 corresponding to address 51 has been read, data already written in blocks 10, ..., and 58 are similarly sequentially read by incrementing address. Thus, by sequentially reading data in the column direction R, data 2_1 to 2_203 constituting slot 1 of frame 2 shown in FIG. 2 are de-interleaved and read.

After second-column data 2_1 to 2_203 have been read, data 3_1 to 3_203 (not illustrated), ..., and data 8_1 to 8_203 are de-interleaved and read by sequentially reading data already written in third-column blocks to eighth-column blocks arranged in the column direction R along the column direction R.

By reading data written in the memory 110*a* of the receiver 110 as described above, data of the superframe 1 which are interleaved and transmitted from the memory 100*a* of the transmitter 100 to the receiver 110 are de-interleaved in the receiver 110. In the case of this embodiment, after data constituting the superframe 1 have been transmitted from the transmitter 100 to the receiver 110, data constituting another superframe 2 are read and transmitted to the receiver 110 in accordance with the procedure same as the procedure for reading data constituting the superframe 1.

Data of the superframe 1 written in the matrix shown in FIG. 4 are sequentially read from block 1 in the column direction R and thereby interleaved. Therefore, after data 1_1 to 1203 have been read from first-column blocks 1, 9, ... 49, and 57, it is possible to newly write data in the first-column blocks 1, 9, ..., 49, and 57 before the read of data constituting eighth-column blocks 8, 16, ..., 56, and 64 is completed. In the case of this embodiment, after data 1_1 to 1_203 have been read from the first-column blocks 1, 9, ..., 49, and 57, the read of data constituting second-column blocks 2, 10, ..., and 58 is started and simultaneously only 203 bytes data constituting another superframe 2 are written in the first-column blocks 1, 9, ..., 49, and 57.

Figure 5:
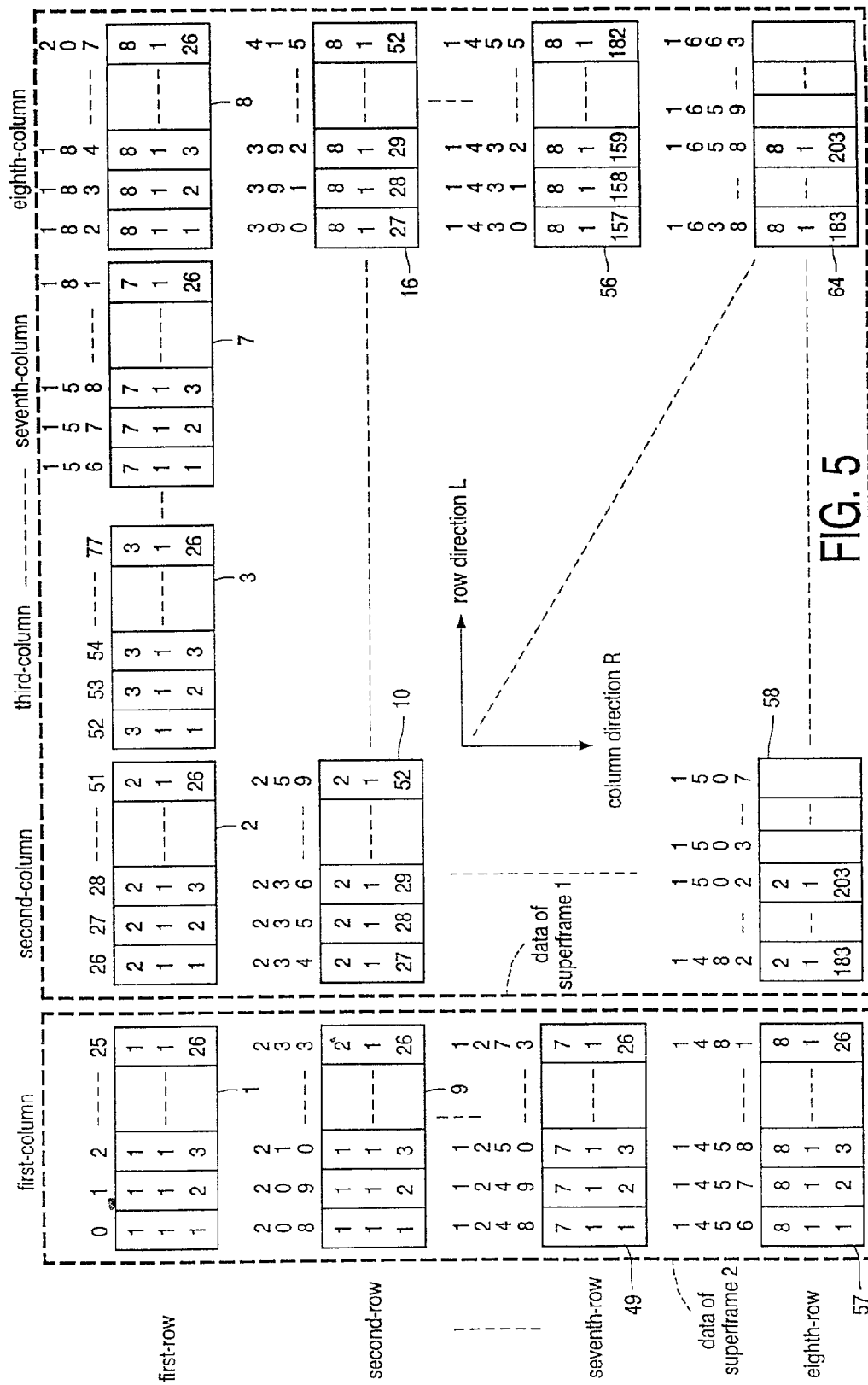

FIG. 5 is a conceptual view showing a state in which only 203 bytes data constituting another superframe 2 are written in blocks 1, 9, ..., 49, and 57.

To write only 203 bytes data constituting another superframe 2 in first-column blocks 1, 9, ..., 49, and 57, data 1_1, 2_1, 3_1, ..., 7_1, and 8_1 are sequentially written in areas corresponding to top addresses 0, 208, ..., 1248, and 1456 of the each blocks in the column direction R.

After data 8_1 have been written in the area corresponding to address 1456, data 1_2, 2_2, ..., 7_2, and 8_2 are sequentially written in areas corresponding to second addresses 1, 209, ..., 1249, and 1457 of blocks 1, 9, ..., 49, and 57 in the column direction R. Hereafter similarly, data 1_n, 2_n, 3_n, ..., 7_n, and 8_n are sequentially written in areas corresponding to nth addresses of blocks 1, 9, ..., 49, and 57 in the column direction R, and finally, data 1_26, 2_26, ..., 7_26, and 8_26 are sequentially written in areas corresponding to final blocks 25, 233, ..., 1273, and 1481 of blocks 1, 9, ..., 49, and 57 in the column direction R. Thus, data are written in blocks 1, 9, ..., 49, and 57.

While data are written in blocks 1, 9, ..., 49, and 57, already-written data of the superframe 1 are sequentially read from second-column blocks 2, 10, ..., and 58 in accordance with the above procedure. Hereafter similarly, data of the superframe 1 written in nth-column blocks are sequentially read in the column direction R and then immediately, data of the superframe 2 are sequentially written in the nth-column blocks in the column direction R.

Therefore, immediately after data of the superframe 1 written in eighth-column blocks have been read, data of the superframe 2 are written in the eighth-column blocks. Thereby, the write of all data of the slot-1 aggregate constituting the superframe 2 is completed.

Figure 6:
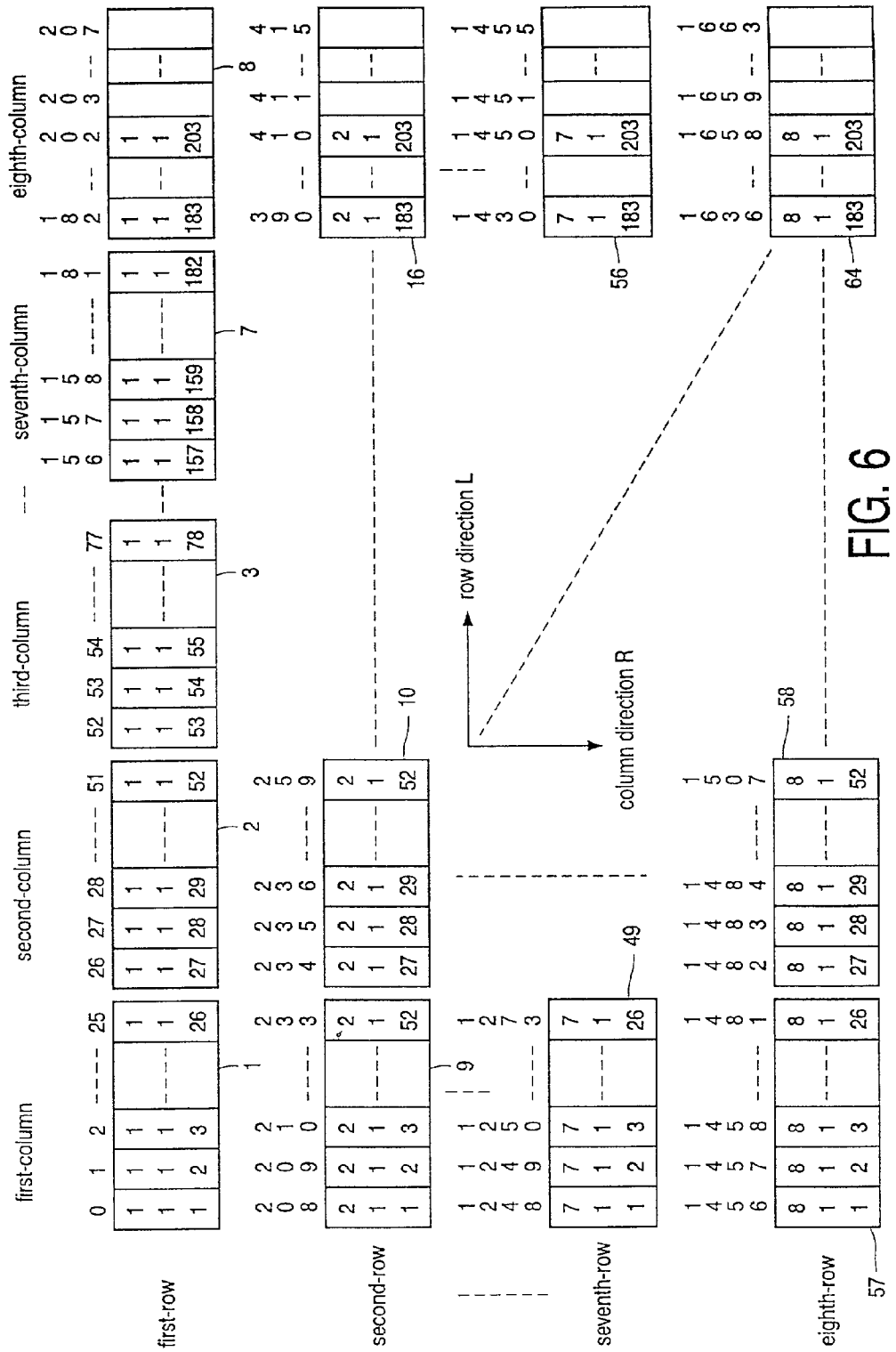

FIG. 6 is a conceptual view showing a state in which all data of the slot-1 aggregate constituting the superframe 2 are written.

As described above, it is possible to write up to 26 data in each block and the slot-1 aggregate consists of 203×8=1624 data. Therefore, when data constituting the slot-1 aggregate are sequentially written in the column direction R as described above, 26(=the number of data written in one block)×7(=the number of blocks arranged in row direction L among the first-column to seventh-column 56 blocks)×8(=the number of blocks arranged in column direction R among the first-column to seventh-column 56 blocks)=1456 data among 1624 data constituting the slot-1 aggregate are written in the first-column to seventh-column 56 blocks among 64 blocks with 8 rows and 8 columns. Therefore, 168(=1624−1456) remaining data are written in eighth-column blocks 8, 16, ..., 56, and 64. Since 26 data can be written in each block, when data are written in eighth-column blocks 8, 16, ..., 56, and 64 in the column direction as described above, the write of 168 remaining data is completed when 21(=168/8) data have written in each of eighth-column blocks 8, 16, ..., 56, and 64 and thus, all data constituting the slot-1 aggregate are written. Therefore, as to the first-column to seventh-column 56 blocks, data are written in all areas corresponding to 26 addresses. As to eighth-column blocks 8, 16, ..., 56, and 64, however, data are written in only areas corresponding to 21 addresses among areas corresponding to 26 addresses but data are not written in areas corresponding to 5 remaining addresses.

Data of the superframe 1 are written in the row direction L and are read in the column direction R and thereby de-interleaved as described by referring to FIG. 4. However, data of the superframe 2 shown in FIG. 6 are written in the column direction R and are read in the row direction L inversely to the case of the superframe 1 and thereby, de-interleaved.

Concretely, after data of the superframe 2 have been written in the column direction R as described by referring to FIGS. 5 and 6, data of first-row block 1, 2, 3, ..., 7, and 8 are read in the row direction L, and thereby data 1_1 to 1_203 are sequentially read. Hereafter similarly, by sequentially reading data in the row direction L about the second-row to eight-row blocks, all data of the superframe 2 are de-interleaved and read. In this case, immediately after data have been read from nth-row blocks, new data of the new superframe 1 generated by the transmitter 100 are interleaved in accordance with the procedure described by referring to FIGS. 2 and 3, and the interleaved data are sequentially written in the nth-row blocks in accordance with the procedure described by referring to FIG. 4. Therefore, immediately after data of the superframe 2 written in eighth-column blocks have been read, new data of the superframe 1 are sequentially written in the eighth-column blocks in the row direction L, and the write of all new data constituting the superframe 1 is completed. Hereafter, data interleaved by the transmitter 100 are sequentially de-interleaved by the receiver 110 while alternately changing the read direction and write direction of data to the row direction L and column direction R in accordance with the procedure described by referring to FIGS. 4 to 6.

As described above, in order to write new data transmitted from the transmitter 100 to the receiver 110 in the memory 110a, the memory drive apparatus 110b operates as follows; in the case of reading the data in the row direction L, immediately after data of 8 blocks arranged in row direction L have been read, new data are written in the same 8 block in the row direction L. On the other hand, in the case of reading the data in the column direction R, immediately after data of 8 blocks arranged in column direction R have been read, new data are written in the same 8 block in the column direction R.

Conventionally, as described above, in order to sequentially write the plenty data interleaved in transmitter into the memory of receiver, it is necessary to use a large capacity memory having not only an area for executing the read of data at present but also an area for allowing new data to be written. On the other hand, in the above first transceiving system, the data interleaved in the transmitter 100 are de-interleaved in the receiver 110 by alternately changing read direction and write direction of data to the row direction L and column direction R. Therefore, immediately after data have been read from an area of a memory of a receiver, it is possible to quickly write new data in the area. Therefore, in the case of this embodiment, it is unnecessary to secure a conventionally necessary area for writing new data, in addition to an area for executing the read of data at present. Therefore, it is possible to decrease the capacity of a memory and to rearrange data at a low cost compared to a conventional case. For example, a memory capacity in which data of two superframes can be written, that is, a capacity of approx. 1.25 Mbits is conventionally necessary as described above in order to de-interleave data transmitted from a transmitter. In the case of this embodiment, however, data of the slot-1 aggregate are arranged into a matrix structure having 8 by 8 blocks, the each blocks allowing up to 26 one-byte(=8 bits) data to be written. Therefore, a capacity of the memory 110a required to de-interleave the data of the slot-1 aggregate is equal to 8(=the number of bits of one data)×26(=the maximum number of data capable of being written in one block)×64(=the number of blocks of one matrix structure)=13312 bits. Since 48 matrix structures are constituted in the case of this embodiment, a capacity necessary for the memory 110a is equal to 13312×48=638976 bits, that is, approx. 0.64 Mbits. Therefore, in the case of this embodiment, the memory 110a requires only half the capacity of a conventional one.

In the case of this embodiment, the write direction of data to be written next to the currently-written data coincides with the read direction of the currently-written data. However, it is also permitted to make the write direction of data to be next written opposite to the read direction of the currently-written data. Concretely, in the case of this embodiment, if currently-written data is read in the row direction L, next data are written in the row direction L. However, it is permitted to write the next data in the row direction L' opposite to the row direction L (refer to FIG. 4). Similarly, when the currently-written data is read in the column direction R, it is permitted to write the next data in the column direction R' opposite to the column direction R.

FIGS. 7 to 13 are illustrations for explaining states in which a plural data are interleaved and the interleaved data are de-interleaved by using a transceiving system (hereafter referred to as second transceiving system) for executing a data processing method to which a second mode of embodiment of a data writing/reading method according to the present invention is applied.

The second transceiving system is different from the previously-described first transceiving system only in configuration of receiver. Therefore, to describe the configuration of the second transceiving system, only the configuration of the receiver is described.

Figures 7, 8:
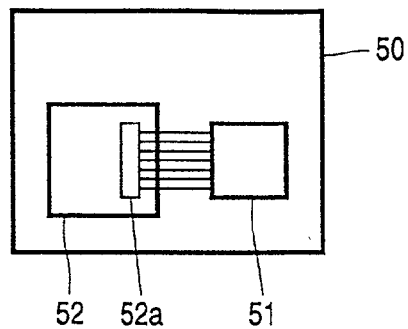

FIG. 7 is a schematic view showing the receiver of the second transceiving system.

Figure 11:
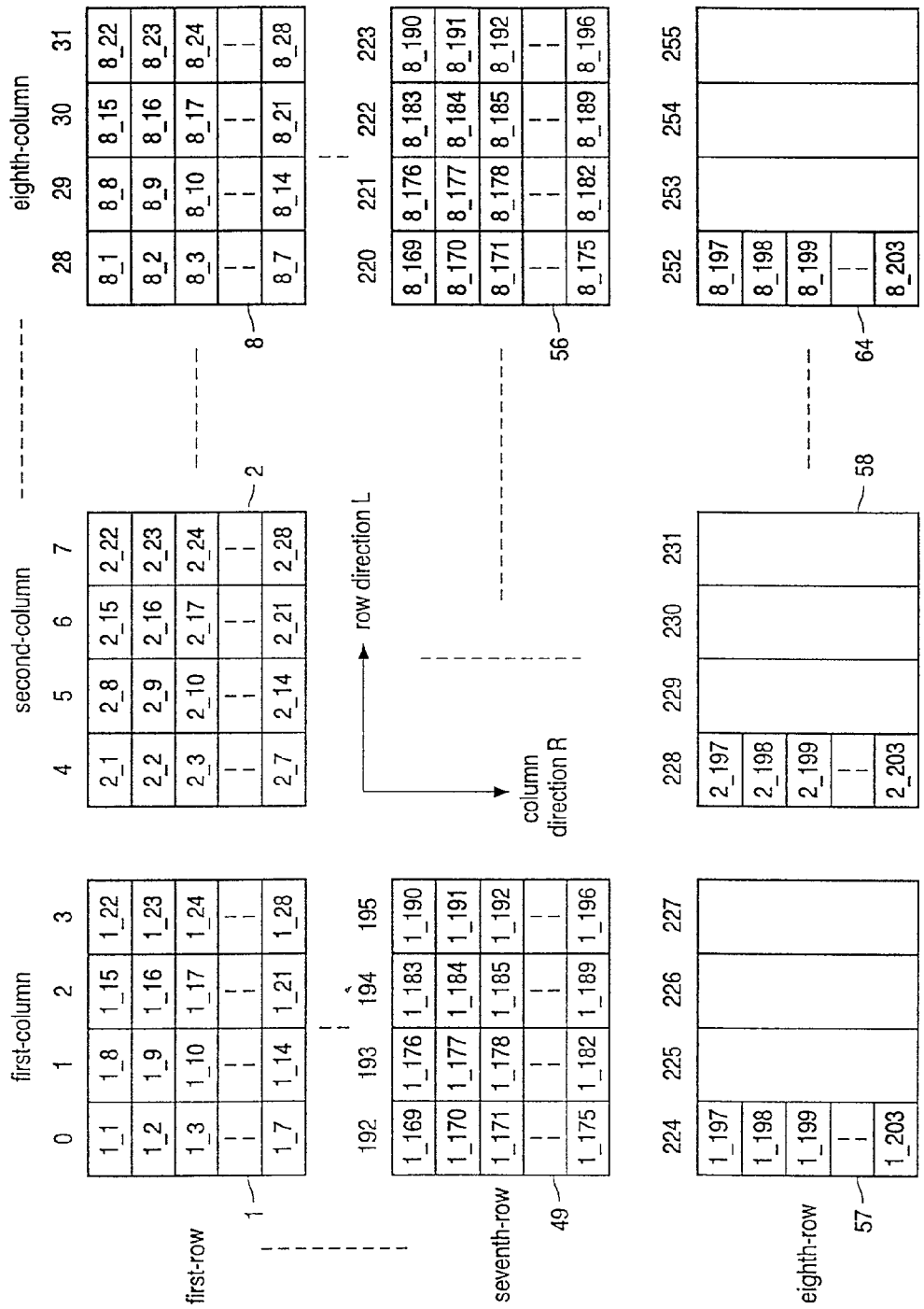

A receiver 50 comprises a memory 51 in which the data transmitted from the transmitter 100 (refer to FIG. 1) is written. Moreover, the receiver 50 comprises a memory drive apparatus (second mode of embodiment of memory drive apparatus according to the present invention) 52. The memory drive apparatus 52 sequentially writes data transmitted from the transmitter 100 in the memory (second mode of embodiment of memory according to the present invention) 51 to arrange the data into a matrix structure, and the memory drive apparatus 52 reads the data arranged into the matrix structure while de-interleaving the data. Data written in the memory 51 are arranged into a matrix structure with 8 by 8 blocks 1, 2, 3, . . . , and 64 as shown in FIG. 11 to be described later. Each block has 4 addresses. Seven 1-byte data are written in an area corresponding to one address of each block. Therefore, it is possible to write up to 4(=the number of addresses of one block)×7(the number of data written in area corresponding to one address)=28 data in one block.

The memory drive apparatus 52 simultaneously writes 7 data in an area corresponding to one address of the memory 51. To simultaneously write 7 data in an area corresponding to one address, the memory drive apparatus 52 temporarily writes the data transmitted from the transmitter 100 in a buffer 52a before writing the data in the memory 51. After that, the memory drive apparatus 52 reads the data from the buffer 52a, and simultaneously writes 7 data in an area corresponding to one address of the memory 51.

FIGS. 8 to 10 are conceptual views for writing data in the buffer 52a and reading the written data.

When data 1_1, . . . , and 8_203 of the slot-1 aggregate consisting of the collection of slots 1 of the each frames shown in FIG. 2 are read in the interleaving direction, the data 1_1, . . . , and 8_203 are temporarily written in the buffer 52a (refer to FIG. 7) in the order in which the transmitter 100 read the each data. The buffer 52a has 64 addresses and one 1-byte data is written in an area corresponding to one address. To write data 1_1, . . . , and 8_203 in the buffer 52a, data transmitted from the transmitter 100 are sequentially written in the row direction L from data 1_1 as shown in FIG. 8 and data 1_1, 2_1, 3_1, . . . , 7_1, and 8_1 are sequentially written in the row direction L in areas corresponding to first-row addresses 0 to 7 arranged in the row direction L. After data 8_1 has been written in the area corresponding to address 7, data 1_2, 2_2, 3_2, . . . , 7_2, and 8_2 are sequentially written in the row direction L in areas corresponding to second-row addresses 8, 9, 10, ..., 14, and 15. Hereafter similarly, data 1_n, 2_n, 3_n, ..., and 8_n are written in the row direction L in areas corresponding to addresses arranged in the row direction L. When data 1_7, 2_7, 3_7, ..., 7_7, and 8_7 have been sequentially written in seventh-row addresses 48, 49, 50, ..., 54, and 55, no data are written in areas corresponding to addresses 56, 57, 58, ..., 62, and 63 but the read of data already written in areas corresponding to addresses 0 to 55 is started. Thus, when data are written in the row direction L, data are not written in areas corresponding to eighth-row addresses but data are written only in areas corresponding to first-row to seventh-row address and thereafter, these written data are read.

To read data, data 1_1, 1_2, ..., and 1_7 are first read from areas corresponding to first-column addresses 0, 8, ..., and 48 arranged in the column direction R and transmitted to the memory 51. That is, 7 data are united into one data group and data of this one data group are simultaneously transmitted to the memory 51. After these 7 data are read in the column direction R, they are rearranged and transmitted to the memory 51.

Immediately after the data group comprising 7 data 1_1, 1_2, ..., and 1_7 written in areas corresponding to first-column addresses 0, 8, ..., and 48 are read, a data group comprising 7 data 2_1, 2_2, ..., and 2_7 is read from areas corresponding to second-column addresses 1, 9, ..., and 49 and at the same time, data 1_8, 2_8, ..., 7_8, and 8_8 newly transmitted from the transmitter 100 are written in areas corresponding to the first-column addresses 0, 8, ..., 48, and 56.

FIG. 9 is a conceptual view showing a state in which new data are written in areas corresponding to first-column addresses 0, 8, ..., and 56.

As shown in FIG. 9, when data are written in the column direction R, the data are written in areas corresponding to eighth-row addresses.

Hereafter, a data group consisting of 7 data 2_1 to 2_7 in areas corresponding to second-column addresses, ..., and a data group consisting of 7 data 8_1 to 8_7 in areas corresponding to eighth-column addresses are sequentially read every data group. Thus, by reading data in the column direction R, each data group consisting of 7 data are rearranged and transmitted to the memory 51. In this case, immediately after data already written in areas corresponding to nth-column addresses are read, new data transmitted from the transmitter 100 are sequentially written in the column direction R in areas corresponding to the nth-column addresses.

FIG. 10 is a conceptual view showing a state immediately after 7 data 8_1 to 8_7 have been read from areas corresponding to eighth-column addresses.

When data are written in the column direction R, as shown in FIG. 10, the data are not written in areas corresponding to eighth-column addresses but the data are written only in areas corresponding to first-column to seventh-column addresses. As a result of comparing FIG. 10 with previously shown FIG. 8, it is found that new data 1_8 to 8_14 are written in FIG. 10. As shown in FIG. 10, after new data have been written, the new data are read in the row direction L, and a data group consisting of first-row 7 data 18 to 1_14, ..., and a data group consisting of eighth-row 7 data 8_8 to 8_14 are sequentially transmitted to the memory 51 every data group. Thereby, while data previously written in the buffer 52a are sequentially read, new data are written in the buffer 52a.

Hereafter, in the buffer 52a, the write and read of data are executed while the write direction and read direction of data are alternately changed to row direction and column direction as described by referring to FIGS. 8 to 10. Data read from the buffer 52a are sequentially transmitted to the memory 51. In this case, when data written the buffer 52a are written in the row direction L, data are not written in areas corresponding to eighth-row addresses but the data are written only in areas corresponding to first-row to seventh-row addresses. On the other hand, when data are written in the column direction R, the data are not written in areas corresponding to eighth-column addresses but the data are written only in areas corresponding to first-column to seventh-column addresses. By writing data in the above manner, when the written data are read in the row direction L or column direction R, data are transmitted to the memory 51 every 7 data. Moreover, as described by referring to FIGS. 8 to 10, data are written in and read from the buffer 52 while alternately changing the write direction and read direction of data to row direction and column direction. Therefore, if the buffer 52a has a capacity for areas corresponding to only 64 addresses (that is, capacity of 64 bytes=512 bits), it is possible to sequentially write new data in the buffer 52a while reading old data from the buffer 52a.

Moreover, each data groups consisting of 7 data temporarily rearranged and being transmitted from the buffer 52a is sequentially written in a matrix structure as shown in FIG. 11. In this case, each data groups transmitted to the memory 51 is sequentially written in the memory 51 in the order in which the each data groups was read from the buffer 52a. To arrange data groups into the matrix structure shown in FIG. 11, firstly, data are written in first-row blocks 1, 2, ..., and 8 arranged in the row direction L. To write data in first-row blocks 1, 2, ..., and 8, a data group consisting of 7 data 1_1 to 1_7, a data group consisting of 7 data 2_1 to 2_7, ..., and a data group consisting of 7 data 8_1 to 8_7 are sequentially written in the row direction L in areas corresponding to top addresses 0, 4, ..., and 28 of blocks 1, 2, ..., and 8.

After the data group consisting of 7 data 8_1 to 8_7 has been written in the area corresponding to the address 28, a data group consisting of 7 data 1_8 to 1_14, a data group consisting of 7 data 2_8 to 2_14, ..., and a data group consisting of 7 data 8_8 to 8_14 are sequentially written in the row direction L in areas corresponding to second addresses 1, 5, ..., and 29 of blocks 1, 2, ..., and 8. Hereafter similarly, each data groups consisting of 7 data are written in areas corresponding to third addresses 2, 6, ..., and 30 of blocks 1, 2, ..., and 8. Finally, a data group consisting of 7 data 1_22 to 1_28, a data group consisting of 7 data 2_22 to 2_28, ..., and a data group consisting of 7 data 8_22 to 8_28 are sequentially written in the row direction L in areas corresponding to fourth addresses 3, 7, ..., and 31 of blocks 1, 2, ..., and 8. Thus, 28 data are written in each of blocks 1, 2, ..., and 8. When independently considering each block, 28 data written in blocks 1 to 8 are 28 data of 203 data constituting each slots 1 of frames 1 to 8 shown in FIG. 2, the 28 data continuously arranged in x-direction from the top of slot.

After data have been written in blocks 1 to 8, new data are further sequentially transmitted from the buffer 52. Hereafter similarly, the write of data in second-row blocks (not illustrated), ..., and the write of data in seventh-row blocks 49 to 56 are performed every blocks arranged in the row direction L. Data 1_169 to 1_196, ..., and data 8_169 to 8_196 are written in seventh-row blocks 49, ..., 56.

After data have been written in blocks 49 to 56, data are written in eighth-row blocks 57 to 64. To write data in blocks 57 to 64, a data group consisting of 7 data 1_197 to 1_203, ..., and a data group consisting of 7 data 8_197 to 8_203 are sequentially written in the row direction L in areas corresponding to top addresses 224 to 252 of blocks 57 to 64. As described above, in the transmitter 100, the read of data constituting the slot-1 aggregate consisting of the collection of slots 1 of each frames is started from data 1_1 in the interleaving direction and finally, data value 8_203 is read. Therefore, when a data group consisting of 7 data 8_197 to 8_203 is written in an area corresponding to address 252 of block 64, the write of all data of the slot-1 aggregate is completed. Thereby, as shown in FIG. 11, data 1_203 to 8_203 are written like a matrix.

As described above, it is possible to write up to 28 data in each block and the slot-1 aggregate consists of 203×8=1624 data. Therefore, when data constituting the slot-1 aggregate are sequentially written in the row direction L as described above, 28(=the number of data written in one block)×7(=the number of blocks arranged in column direction R among the first-row to seventh-row blocks 1 to 56)×8(=the number of blocks arranged in row direction L among the first-row to seventh-row blocks 1 to 56)=1568 data among 1624 data constituting the slot-1 aggregate are written in the first-row to seventh-row blocks 1 to 56 among 64 blocks 1 to 64 with 8 rows and 8 columns. Therefore, 56 (=1624-1568) remaining data are written in eighth-row blocks 57 to 64. Since 28 data can be written in each block, if data are written in eighth-row blocks 57 to 64 in the row direction L as described above, the write of 56 remaining data is completed when 7 data are written in an area corresponding to each of top addresses of eighth-row blocks 57 to 64 and thereby, all data constituting the slot-1 aggregate are written. Therefore, as to the first-row to seventh-row blocks 1 to 56, data are written in all areas corresponding to 4 addresses. However, as to the eighth-row blocks 57 to 64, data are written only in an area corresponding to one address among areas corresponding to 4 addresses but no data is written in areas corresponding to three remaining addresses.

After data have been written in eighth-row blocks 57 to 64, data are read from blocks 1 to 64.

Data are sequentially read from first-column blocks 1, . . . , 49, and 57 arranged in the column direction R. To read data from these blocks 1, . . . , 49, and 57, addresses 0 to 3 of block 1 are sequentially addressed while incremented address one by one. By this, data 1_1 to 17, 1_8 to 1_14, 1_15 to 1_21, and 1_22 to 1_28 are sequentially read from areas corresponding to addresses 0, 1, 2, 3, and 4. After 7 data 1_22 to 1_28 have been read from the area corresponding to address 3, data are hereafter similarly sequentially read from blocks 9 (not illustrated), . . . , 49, and 57 arranged in first-column by incrementing addresses. Thus, by sequentially reading data in the column direction R, data 1_1 to 1_203 constituting slot 1 of frame 2 shown in FIG. 2 are de-interleaved and read.

After data have been read from blocks 1, . . . , 49, and 57, data are read from second-column blocks 2, . . . , and 58. To read data from blocks 2, . . . , and 58, data 2_1 to 2_7, 2_8 to 2_14, 2_15 to 221, 2_22 to 2_28 are sequentially read from areas corresponding to addresses 4, 5, 6, and 7 by sequentially designating addresses of block 2 while incrementing the addresses one by one starting with the top address. After data 2_22 to 2_28 are read from the area corresponding to the address 7, data are similarly sequentially read from blocks 10 (not illustrated), . . . , and 58 by incrementing addresses. By sequentially reading data in the column direction R in the above manner, data 2_1 to 2_203 constituting slot 1 of frame 2 shown in FIG. 2 are de-interleaved and read.

After second-column data 2_1 to 2_203 have been read, data are sequentially read from third-column, . . . , eighth-column blocks in the column direction R and thereby, data 3_1 to 3_203 (not illustrated), . . . , and data 8_1 to 8_203 are de-interleaved and read.

By reading data written in the row direction L along the column direction R as described above, data (which constituting superframe 1) interleaved at the transmitter 100 is de-interleaved. After data constituting the superframe 1 have been transmitted from the transmitter 100 to the receiver 50, data constituting another superframe 2 are read in accordance with the same procedure as the procedure for reading data constituting the superframe 1, and the read data is transmitted to the receiver 50.

Moreover, in the second transceiving system, after data 1_1 to 1_203 written in first-column blocks 1, . . . , 49, and 57 have been de-interleaved and read, data constituting second-column blocks 2, . . . , and 58 are read as described above and simultaneously, only 203 bytes data constituting the superframe 2 are read from the buffer 52a and written in the first-column blocks 1, . . . , 49, and 57.

Figure 12:
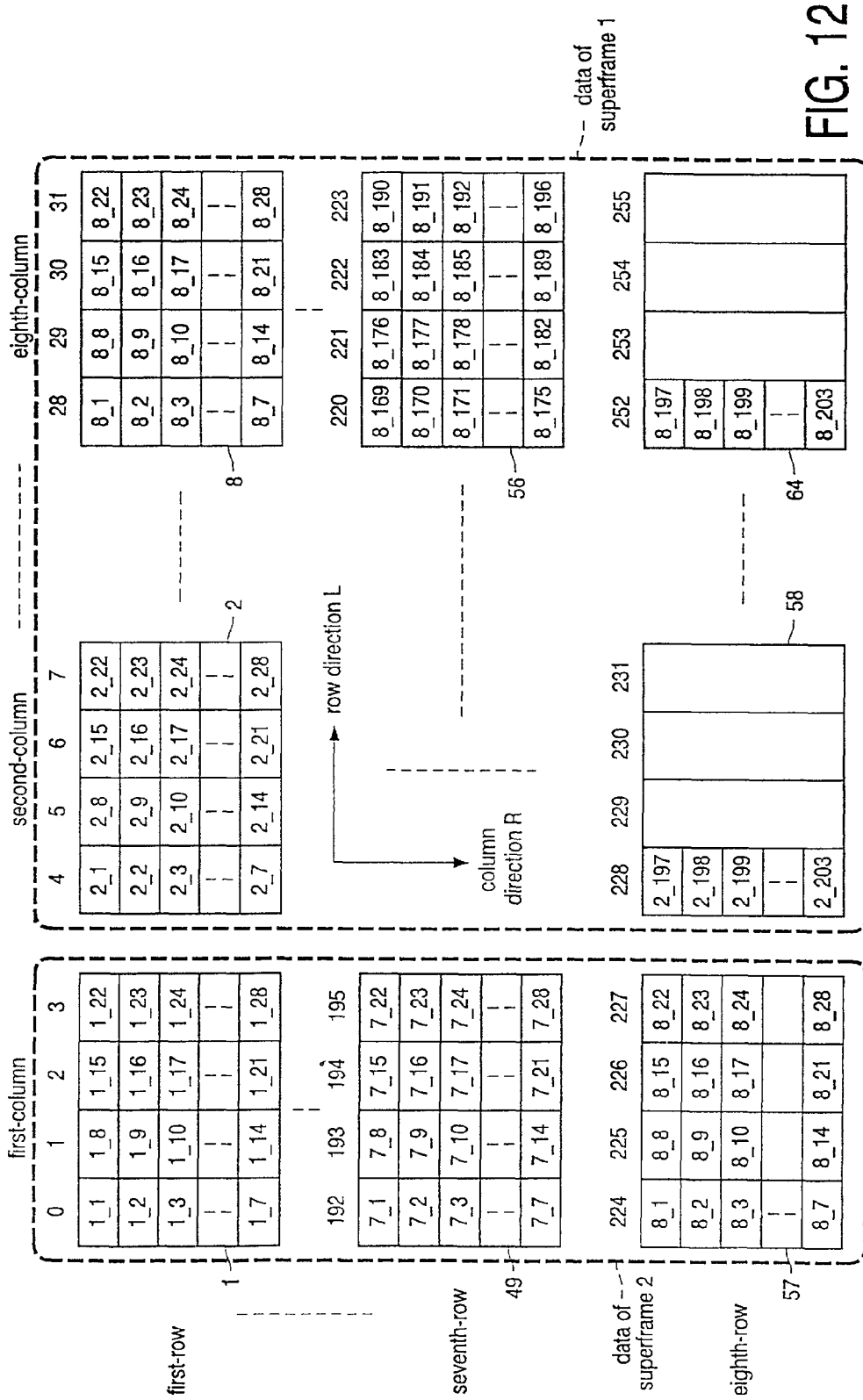

FIG. 12 is a conceptual view showing a state in which only 203 bytes data constituting the superframe 2 are written in blocks 1, . . . , 49, and 57.

To write only 203 bytes data constituting the superframe 2 in first-column blocks 1, . . . , 49, and 57, a data group consisting of 7 data 1_1 to 1_7, . . . , a data group consisting of 7 data 7_1 to 7_7, and a data group consisting of 7 data 8_1 to 8_7 are sequentially written in the column direction R in areas corresponding to top addresses 0, . . . , 192, and 224 of the blocks.

After data group consisting of 7 data 8_1 to 8_7 are written in the area corresponding to address 224, a data group consisting of 7 data 1-8 to 1_14, . . . , a data group consisting 7 data 7-8 to 7_14, and a data group consisting of 7 data 8_8 to 8_14 are sequentially written in the column direction R in areas corresponding to second addresses 1, . . . , 193, and 225 of blocks 1, . . . , 49, and 57. Hereafter similarly, each data groups consisting of 7 data are sequentially written in the column direction R in areas corresponding to third addresses of blocks 1, . . . , 49, and 57. Finally, a data group consisting of 7 data 1_22 to 1_28, . . . , a data group consisting of 7 data 7_22 to 7_28, and a data group consisting of 7 data 8_22 to 8_28 are sequentially written in the column direction R in areas corresponding to final addresses 3, . . . , 195, and 227 of blocks 1, . . . , 49, and 57. Thus, data are written in blocks 1, . . . , 49, and 57.

While data are written in blocks 1, . . . , 49, and 57, the already-written data of superframe 1 are sequentially read from second-column blocks 2, . . . , and 58 in accordance with the above procedure. Hereafter similarly, immediately after data of the superframe 1 written in nth-column blocks have been sequentially read in the column direction R, data of another superframe 2 are sequentially written in blocks of the nth column in the column direction R.

Therefore, immediately after data of the superframe 1 already written in eighth-column blocks have been read, data of the superframe 2 are written in eighth-column blocks and the write of all data constituting the slot-1 aggregate of the superframe 2 is completed.

Figure 13:
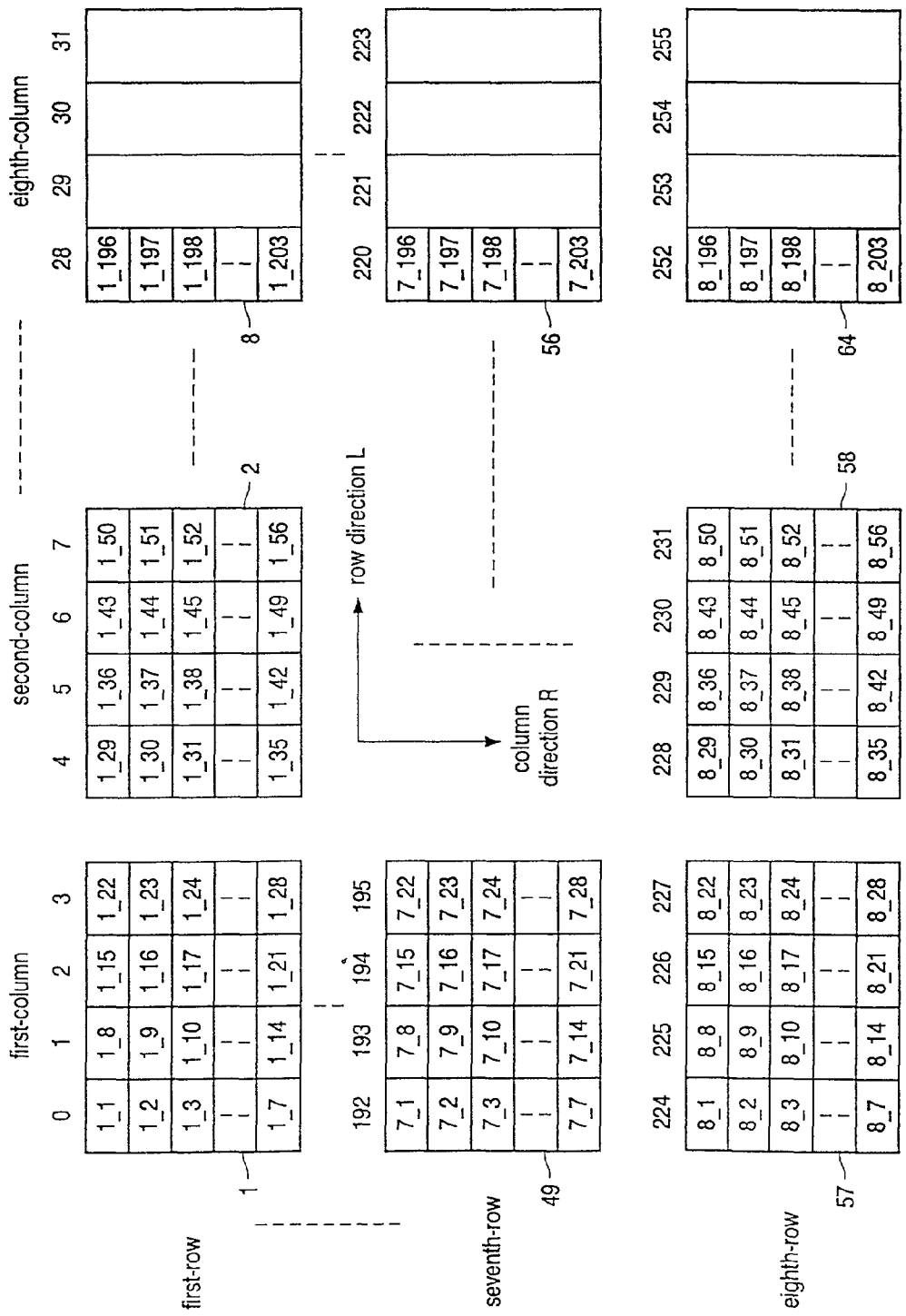

FIG. 13 is a conceptual view showing a state in which all data constituting the slot-1 aggregate of the superframe 2 are written.

As described above, it is possible to write up to 28 data in each block and the slot-1 aggregate consists of 203×8=1624 data. Therefore, when data constituting the slot-1 aggregate are sequentially written in the column direction R as described above, 28(=the number of data written in one block)×7(=the number of blocks arranged in row direction L among the first-column to seventh-column 56 blocks)×8(=the number of blocks arranged in column direction R among the first-column to seventh-column 56 blocks)=1568 data among 1624 data constituting the slot-1 aggregate are written in the first-column to seventh-column 56 blocks among 64 blocks 1 to 64 with 8 rows and 8 columns. Therefore, 56 (=1624-1568)

remaining data are written in eighth-column blocks 8, ..., 56, and 64. Since, 28 data can be written in each block, by writing data in eighth-column blocks 8, ..., 56, and 64 in the column direction R as described above, the write of 56 remaining data is completed when 7 data are written in each areas corresponding to top addresses of eighth-column blocks 8, ..., 56, and 64 and thus, all data constituting the slot-1 aggregate are written. Therefore, as to the first-column to seventh-column 56 blocks, data are written in all areas corresponding to 4 addresses. On the other hand, as to the eighth-column blocks 8, ..., 56, and 64, data are written in only an area corresponding to one address among areas corresponding to 4 addresses but data are not written in areas corresponding to 3 remaining addresses.

Data of the superframe 1 is written in the row direction L, read in the column direction R, and de-interleaved as described by referring to FIG. 11. However, data of the superframe 2 is written in the column direction R inversely to the case of the superframe 1 as described by referring to FIGS. 12 and 13, after that, the written data are read in the row direction L and de-interleaved.

Concretely, addresses 0 to 28 are sequentially incremented and addressed, data of first-row blocks 1, 2, ..., and 8 are read in the row direction L, and data 1_1 to 1_203 are read. Hereafter similarly, by sequentially reading data of second-row to eighth-row blocks in the row direction L, all data constituting the superframe 2 are de-interleaved and read. In this case, immediately after data already written in nth-row blocks are read, data of the superframe 1 are sequentially written in the nth-row blocks in accordance with the procedure described by referring to FIG. 11. Therefore, immediately after data of the superframe 2 already written in eighth-row blocks are read, new data of the superframe 1 are sequentially written in the eighth-row blocks in the row direction L in accordance with the procedure described by referring to FIG. 11. Thus, the write of all data constituting the slot-1 aggregate of the new superframe 1 is completed. Hereafter, data interleaved by the transmitter 100 are sequentially de-interleaved by the receiver 110 while alternately changing read direction and write direction of data to the row direction L and column direction R in accordance with the procedure described by referring to FIGS. 11 to 13.

In the case of the first transceiving system previously described, one byte data is written in an area corresponding to one address to form one byte/word. In the case of the second transceiving system, however, 7 bytes data is written in an area corresponding to one address to form 7 bytes/word. Thus, when setting one word to a plural bytes, the buffer 52*a* for temporarily storing the data transmitted from the transmitter 100 is necessary in addition to the memory 51. However, the buffer 52*a* requires only a very small capacity such as 64 bytes=512 bits as described above. That is, in the case of the second transceiving system, the sum of a capacity necessary for the buffer 52*a* and a capacity necessary for the memory 51 is equal to 512 bits+0.64 Mbits □ 0.64 Mbits. Therefore, the second transceiving system makes it possible to de-interleave data by a small memory capacity compared to the case of a conventional transceiving system requiring a capacity for two superframes (approx. 1.25 Mbits) for the memory of a receiver.

Moreover, in the case of the first transceiving system, since data of one byte/word is written in the memory 110*a*, the memory 110*a* requires addresses 0 to 1663 as shown in FIGS. 4 to 6. On the other hand, in the case of the second transceiving system, since data of 7 bytes/word is written in the memory 51, it is enough to prepare only addresses 0 to 255, for the memory 51 as shown in FIGS. 11 to 13. Therefore, by setting one word to a plural bytes, advantages are obtained that a memory requires less addresses and the configuration of an address generation circuit can be simplified. Moreover, by setting one word to a plural bytes, it is possible to write data of a plural bytes in an area corresponding to one address at the same time. Therefore, advantages are obtained that data can be efficiently written even if a memory having a low access speed is used.

The first and second transceiving systems respectively de-interleaves data constituting a slot aggregate consisting of slots marked the same number of 8 frames (that is, slot aggregate consisting of 8 slots) by arranging the data into a matrix structure having 8 by 8 blocks. That is, the matrix structure has a structure in which the number of blocks arranged in the row direction L is equal to the number of blocks arranged in the column direction R. By equalizing the number of blocks arranged in the row direction L with the number of blocks arranged in the column direction R, it is possible to minimize the number of memory cells of a memory in which no data is written even if the data constituting a slot aggregate consisting of 8 slots are written in the row direction or column direction. Therefore, data are written efficiently in the memory.

In the case of the first and second transceiving systems, the number of blocks arranged in the row direction L is equalized with the number of blocks arranged in the column direction R by arranging a plural interleaved data into a matrix structure having 8 by 8 blocks. In the case of the present invention, however, it is unnecessary to arrange a plural interleaved data into a matrix structure having blocks provided with same numbers blocks as to row and column directions. It is permitted that the number of blocks is different in row and column directions. By making the write direction of a plural data to be written in a memory next to a plural data currently written in the memory same as or opposite to the read direction of the currently-written data, it is also possible to reduce the cost for de-interleaving a plural interleaved data.

Moreover, in the case of the first and second transceiving systems, a state is shown in which data are rearranged at a low cost by using an example in which a plural interleaved data are written in a memory provided for a receiver and then, the data written in the memory are de-interleaved and read. However, rearrangement of data performed at the transmitter side can be also performed at a low cost by using a data writing/reading method according to the present invention.

According to the present invention, we can obtain a writing/reading method, a de-interleaving method, a data processing method, a memory, and a memory drive whose costs are reduced.

FIG. 1 is an illustration showing one example of a first transceiving system.

FIG. 2 is a diagram showing a superframe configured.

FIG. 3 is a diagram showing the state of reading 203 data in the interleaving direction counting from data 1_1 of a slot 1 of a frame 1.

FIG. 4 is an illustration showing the state of arranging data in matrix structures having 64 blocks ranging with 8 rows and 8 columns.

FIG. 5 is a concept view showing the state of writing 203 bytes data configuring another super frame 2 into block 1, block9, ..., block 49 and block 57.

FIG. 6 is a concept view showing the state of writing all the data of a slot-1 aggregate of the super frame 2.

FIG. 7 is a schematic illustration showing a receiver in the transceiving system.

FIG. 8 is a concept view showing the state of writing data into buffer.

FIG. 9 is a concept view showing the state of writing new data into areas corresponding to the first-column address 0, address 8, . . . , address 56.

FIG. 10 is a concept view showing the state immediately after reading 7 data 8_1 to data 8_7 already written into areas corresponding to the eighth-column addresses.

FIG. 11 is a concept view showing the state of sequentially writing each data group consisting of the interleaved 7 data transmitted from a buffer 52a in matrix structures.

FIG. 12 is a concept view showing the state of writing 203 bytes data configuring the superframe 2 into block 1, . . . , block 49 and block 57.

FIG. 13 is a concept view showing the state of writing all the data configuring a slot-1 aggregate of the super frame 2.

50, 100 receiver
51, 100a, 110a memory
52, 100b, 110b memory drive apparatus
52a buffer
100 transmitter

The invention claimed is:

1. A data writing/reading method of sequentially writing a plurality of data into a memory in a write direction, and sequentially reading the plurality of data written into the memory in a read direction, characterized in that a first plurality of data is written into the memory in a first write direction, the first plurality of data being read from the memory in a first read direction different from the first write direction, a second plurality of data being written after the first plurality of data in a second write direction which is equal to or is opposite to the first read direction; wherein when plural data having written into the memory at present are read in a row direction, plural data which is next to be written are sequentially written in the row direction, on the other and, when plural data having written into the memory at present are read in a column direction, plural data which is the next to be written are sequentially written in the column direction.

2. A data writing/reading method as claimed in claim 1, wherein plural data are arranged into the memory in matrix structures having n by n blocks, each of the blocks having at least one address, and each of the blocks for writing at least one data into an area corresponding to the one address of each of the blocks.

3. A method of de-interleaving by sequentially writing a plurality of data into a memory in a write direction, and sequentially reading the plurality of data written into the memory in a read direction, characterized in that a first plurality of data is written into the memory in a first write direction, the first plurality of data being read from the memory in a first read direction different from the first write direction, a second plurality of data being written after the first plurality of data in a second write direction which is equal to or is opposite to the first read direction; wherein when plural data having written into the memory at present are read in a row direction, plural data which is next to be written are sequentially written in the row direction, on the other hand, when plural data having written into the memory at present are read in a column direction, plural data which is the next to be written are sequentially written in the column direction.

4. A de-interleaving method as claimed in claim 3, wherein plural data are arranged into the memory in matrix structures having n by n blocks, each of the blocks having at least one address, and each of the blocks for writing at least one data into an area corresponding to the one address of each of the blocks.

5. A data processing method comprising a first step of interleaving a plurality of data, and a second step of de-interleaving by sequentially writing a plurality of data into a memory in a write direction, and sequentially reading the plurality of data written into the memory in a read direction, characterized in that a first plurality of data is written into the memory in a first write direction, the first plurality of data being read from the memory in a first read direction different from the first write direction, a second plurality of data being written after the first plurality of data in a second write direction which is equal to or is opposite to the first read direction; wherein when plural data having written into the memory at present are read in a row direction, plural data which is next to be written are sequentially written in the row direction, on the other hand, when plural data having written into the memory at present are read in a column direction, plural data which is the next to be written are sequentially written in the column direction.

6. A data processing method as claimed in claim 5, wherein the first step contains configuring a super frame having plural frames, each of the frames formed by arranging plural data in matrix form, and contains interleaving the plural data configuring the super frame.

7. A data processing method as claimed in claim 5, wherein the second step is characterize in that interleaved plural data are arranged into the memory in matrix structures having n by n blocks, each of the blocks having at least one address, and each of the blocks for writing at least one data into an area corresponding to the one address of each of the blocks.

8. A data processing method as claimed in claim 7, wherein the first step is characterized by configuring a super frame having eight frames, each of the frames formed by arranging (203×48) data in matrix form, and is characterized by interleaving (203×48×8) data configuring the super frame, and the second step is characterized in that when (203×48×8) data having written into the memory at present are read in a row direction, (203×48×8) data which is the next to be written are sequentially written in the row direction, on the other hand, when (203×48×8) data having written into the memory at present are read in a column direction, (203×48×8) data which is the next to be written are sequentially written in the column direction.

9. A data processing method as claimed in claim 8, wherein the second step is for arranging (203×48×8) data into the memory in 48 matrix structures, each of the 48 matrix structures formed from (203×8) data, and each of the 48 matrix structures is the structure having n by n blocks, each of the blocks having at least one address, and each of the blocks for writing at least one data into an area corresponding to the one address of each of the blocks.

10. A data processing method as claimed in claim 9, wherein each of the 48 matrix structures is the structure having 8 by 8 blocks, each of the blocks having 26 addresses, and each of the blocks for writing one data into an area corresponding to the one address of each of the blocks, and the second step is for writing one data into the area corresponding to the one address of each of the blocks.

11. A data processing method as claimed in claim 9, wherein each of the 48 matrix structures is the structure having 8 by 8 blocks, each of the blocks having 4 addresses, and each of the blocks for writing 7 data into an area corresponding to the one address of each of the blocks, and the second step is for writing 7 data into the area corresponding to the one address of each of the blocks.

12. A memory for sequentially writing a plurality of data into a memory in a write direction, and sequentially reading the plurality of data written into the memory in a read direction, characterized in that a first plurality of data is written into the memory in a first write direction, the first plurality of data being read from the memory in a first read direction different from the first write direction, a second plurality of data being written after the first plurality of data in a second write direction which is equal to or is opposite to the first read direction; wherein when plural data having written into the memory at present are read in a row direction, plural data which is next to be written are sequentially written in the row direction, on the other hand, when plural data having written into the memory at present are read in a column direction, plural data which is the next to be written are sequentially written in the column direction.

13. A memory drive apparatus for sequentially writing a plurality of data into a memory in a write direction, and sequentially reading the plurality of data written into the memory in a read direction, characterized in that a first plurality of data is written into the memory in a first write direction, the first plurality of data being read from the memory in a first read direction different from the first write direction, a second plurality of data being written after the first plurality of data in a second write direction which is equal to or is opposite to the first read direction; wherein when plural data having written into the memory at present are read in a row direction, plural data which is next to be written are sequentially written in the row direction, on the other hand, when plural data having written into the memory at present are read in a column direction, plural data which is the next to be written are sequentially written in the column direction.

14. A memory drive apparatus as claimed in claim 13, wherein the apparatus provides with addressing means for addressing the memory, and by sequentially addressing the memory with the addressing means, plural data are arranged into the memory in matrix structures having n by n blocks, each of the blocks having at least one address, and each of the blocks for writing at least one data into an area corresponding to the one address of each of the blocks.

* * * * *